United States Patent
Steiner

(10) Patent No.: US 7,298,168 B1
(45) Date of Patent: Nov. 20, 2007

(54) METHOD AND APPARATUS FOR ERROR MITIGATION OF PROGRAMMABLE LOGIC DEVICE CONFIGURATION MEMORY

(75) Inventor: Glenn C. Steiner, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/787,813

(22) Filed: Apr. 18, 2007

Related U.S. Application Data

(62) Division of application No. 11/252,682, filed on Oct. 18, 2005, now Pat. No. 7,236,000.

(51) Int. Cl.
*H03K 19/003* (2006.01)

(52) U.S. Cl. .............................. 326/10; 326/9; 326/11

(58) Field of Classification Search ............... 326/9–12
See application file for complete search history.

(56) References Cited

U.S. PATENT DOCUMENTS

| | | | |
|---|---|---|---|
| 5,426,378 A | 6/1995 | Ong | |
| 5,646,545 A | 7/1997 | Trimberger et al. | |
| 6,812,731 B1 | 11/2004 | Trimberger | |
| 7,036,059 B1 | 4/2006 | Carmichael et al. | |
| 7,250,786 B1 * | 7/2007 | Trimberger | 326/11 |

OTHER PUBLICATIONS

U.S. Appl. No. 11/184,375 by Trimberger on Jul. 19, 2005 filed by Xilinx, Inc.

U.S. Appl. No. 11/184,376 by Trimberger on Jul. 19, 2005 filed by Xilinx, Inc.

U.S. Appl. No. 11/184,498 by Trimberger on Jul. 19, 2005 filed by Xilinx, Inc.

\* cited by examiner

*Primary Examiner*—Anh Q. Tran
(74) *Attorney, Agent, or Firm*—Michael Wallace; Lois D. Cartier

(57) ABSTRACT

A method and apparatus to reduce the probability of programmable logic device (PLD) failure due to single event upset (SEU) of configuration memory. A first portion of configuration memory cells are initially programmed with configuration data, leaving a second portion of configuration memory cells that are un-programmed. The programmed and un-programmed configuration memory cells are grouped into voting groups, where each un-programmed configuration memory cell of each voting group is programmed with the identical configuration data as contained within the originally programmed configuration memory cell of each voting group. The logic values of each configuration memory cell of each voting group are monitored by voting circuits, which enforce a triple modular redundancy (TMR) validation policy. The logical validation results are then applied to control points to mitigate PLD configuration memory errors caused by anomalous events such as neutron induced SEUs.

13 Claims, 5 Drawing Sheets

METHOD AND APPARATUS FOR ERROR MITIGATION OF PROGRAMMABLE LOGIC DEVICE CONFIGURATION MEMORY

FIELD OF THE INVENTION

The present invention generally relates to programmable logic devices (PLDs), and more particularly to single event upset (SEU) error mitigation of configuration memory within those PLDs.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Programmable logic devices can be susceptible to functional failure under certain circumstances. The configuration memory cells, for example, that are used to program the PLD's functionality can inadvertently "flip", or in other words, change their logic state. Such failures may be caused by single event upsets (SEUs), or other radiation induced errors, which can lead to functional failure.

With the ever decreasing geometry size of semiconductor based configuration memory cells, the configuration memory cells are becoming more susceptible to SEU failures. In particular, neutron induced SEUs have a greater impact as geometries of the memory cells are reduced, since the relative size of the neutron with respect to the configuration memory cell grows. As such, neutrons that are incident to a silicon nucleus of a semiconductor device within a particular configuration memory cell may induce an alpha particle to be released by the semiconductor device. Once the alpha particle is released, its ionic polarization may be such that the logic state of the semiconductor device is "flipped", or reversed, potentially causing soft failure (i.e., recoverable via reconfiguration), or catastrophic failure. Efforts continue, therefore, to mitigate such SEU based failures.

SUMMARY

To overcome limitations in the prior art, and to overcome other limitations that will become apparent upon reading and understanding the present specification, various embodiments of the present invention include apparatus and methods for a programmable logic device that provide error mitigation through usage of unused configuration memory in a given programmable logic device (PLD).

In accordance with one embodiment of the invention, an integrated circuit (IC) comprises a plurality of configuration memory cells and a plurality of voting circuits. Each of the voting circuits is coupled to a different subset of the configuration memory cells and each of the configuration memory cells is coupled to a plurality of the voting circuits. The IC further comprises a plurality of control points, where each control point is coupled to an output terminal of one of the voting circuits.

In accordance with another embodiment of the invention, a method of reliably configuring a programmable logic device (PLD) comprises storing configuration data into a first portion of configuration memory cells existent within the PLD to define a logic function, identifying a second portion of configuration memory cells that are void of the configuration data that defines the logic function, and utilizing the second portion of configuration memory cells as redundant memory cells. The redundant memory cells are used to verify a validity of the configuration data stored within the first portion of configuration memory cells.

In accordance with another embodiment of the invention, a method of mitigating configuration memory cell errors in a programmable logic device (PLD) comprises programming a first set of configuration memory cells to implement a logic function, identifying a second set of configuration memory cells that are not programmed for the logic function, programming a portion of the second set of configuration memory cells to reflect a logic state of a corresponding portion of configuration memory cells in the first set, comparing logic values of the portion of the second set of configuration memory cells to logic values of the corresponding portion of configuration memory cells in the first set, selecting a logic value from the compared logic values that conforms to a redundancy rule, and applying the selected logic value to a control point within the PLD to implement the logic function.

BRIEF DESCRIPTION OF THE DRAWINGS

Various aspects and advantages of the invention will become apparent upon review of the following detailed description and upon reference to the drawings, in which.

DETAILED DESCRIPTION

Generally, various embodiments of the present invention provide apparatus and methods of providing an error mitigation scheme to reduce the effects of single event upset (SEU) induced errors within programmable logic devices (PLDs). In particular, each PLD contains reconfigurable logic and interconnect resources whose functions are controlled via static memory cells. SEU upsets may occur which, in some instances, are effective to change the logic value contained within the memory cells. Since these memory cells can directly affect the particular logic function implemented by the reconfigurable logic and interconnect resources, functional failures within the PLD may be observed.

The memory cells are often configured into configuration data arrays, whose contents may be accessed via address and data busses. Thus, for a given address, a data word containing multiple configuration bits intended for a portion of the configuration data array may be written to the configuration data array. Incrementing the address bus throughout the configuration data array address space and changing each data word in accordance with each address change, is effective to completely configure a PLD's configuration data array to implement a particular logic function.

Unlike some other memory configurations, memory cells that define a logic function within a PLD are generally sensed in a continuous fashion. As such, if a memory cell undergoes a single event upset that is effective to "flip", i.e., change, the logic state of the memory cell, then the logic function associated with that particular memory cell may be immediately affected, which may cause soft or catastrophic failure.

Statistically, only a small percentage of the available configuration memory space is typically utilized for a given logic design within a PLD. For example, approximately 10% of the available configuration memory cells within a PLD may be utilized in a design implementation, which provides for an appreciable number of configuration memory cells that may be available for other use. As such, various embodiments in accordance with the present invention provide an apparatus and various methods to utilize the unused configuration memory cells to mitigate the effects of failures caused by SEUs, or any other mechanism that causes the logic state of a configured memory cell to flip.

Figure 1:
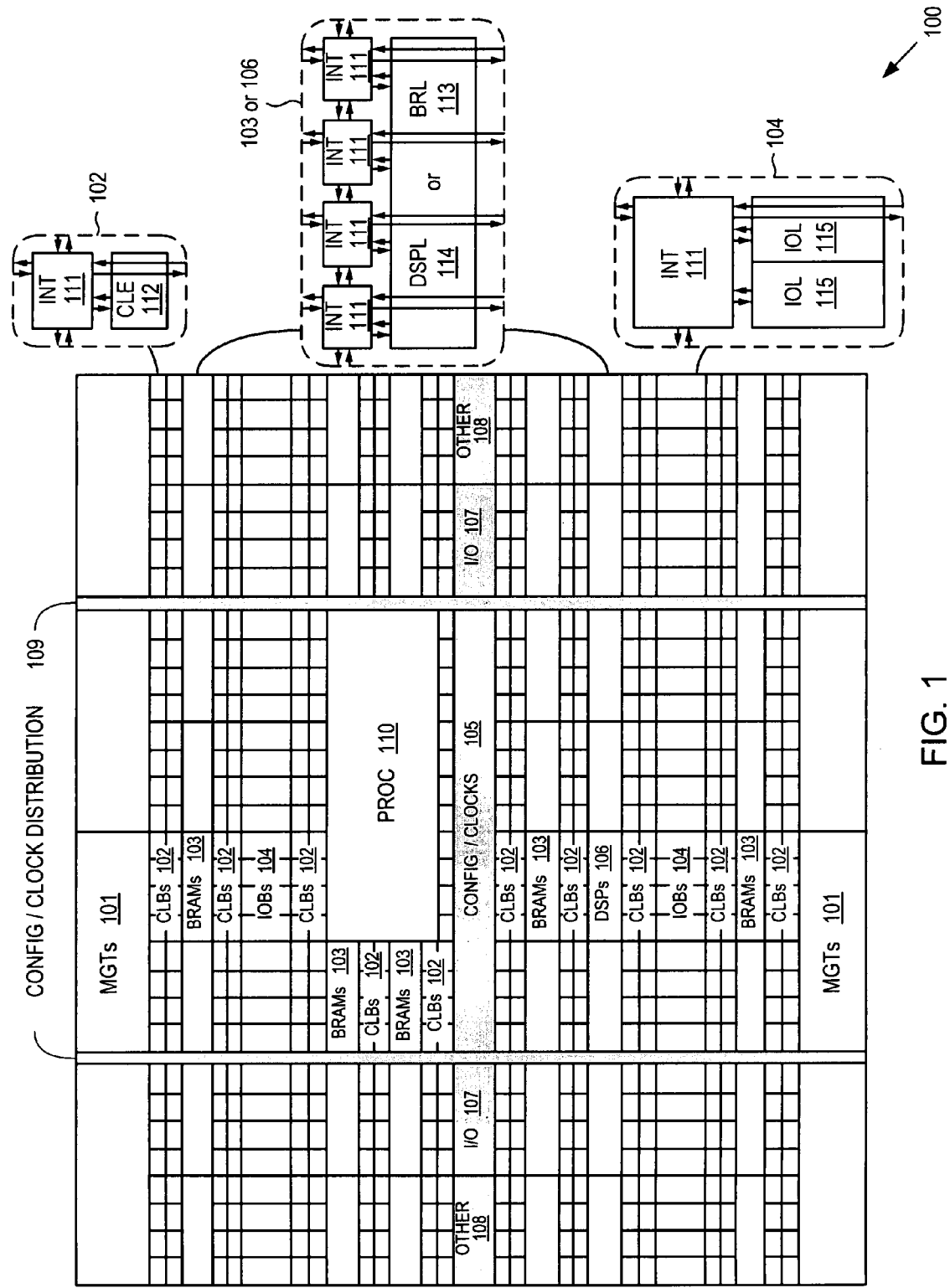
FIG. 1 illustrates an integrated circuit (IC) that exemplifies a Field Programmable Gate Array (FPGA) architecture.

As noted above, advanced integrated circuits (ICs), such as FPGAs, can include several different types of programmable logic blocks in the array. For example, FIG. 1 illustrates an IC that exemplifies FPGA architecture 100, including a large number of different programmable tiles such as Multi-Gigabit Transceivers (MGTs) 101, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth. Some FPGAs also include dedicated processor blocks PROC 110, in which specific CPU related functionality may be utilized that is separate from the FPGA fabric.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102 and 104.

For example, a CLB 102 may include a Configurable Logic Element CLE 112 that may be programmed to implement user logic plus a single programmable interconnect element INT 111. A BRAM 103 can include a BRAM logic element (BRL 113) in addition to one or more programmable interconnect elements. Typically, the number of interconnect elements included in a tile depends on the height of the tile (as measured from right to left of FIG. 1). In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 may include, for example, two instances of an input/output logic element IOL 115 in addition to one instance of the programmable interconnect element INT 111.

As will be clear to those of skill in the art, the actual I/O pads connected, for example, to the I/O logic element 115 are manufactured using metal layers above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 may span several columns of CLBs and BRAMs.

Note that FIG. 1 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 102, 103, and 104 are purely exemplary. For example, in an actual FPGA more than one adjacent column of CLBs is typically included wherever the CLBs appear, to facilitate the efficient implementation of user logic.

As discussed above, configuration of a PLD may be performed via memory cells that store configuration control data, where each memory cell stores a single bit of configuration control data. The configuration control data may be used to control the conductivity state of pass transistors in multiplexers, to serve as logic values in lookup tables, or to perform some other configuration function. The configuration control data bits can be stored in volatile memory (e.g., static memory cells, as in FPGAs and some CPLDs), in non-volatile memory (e.g., FLASH memory, as in some CPLDs), or in any other type of memory cell.

Figure 2:
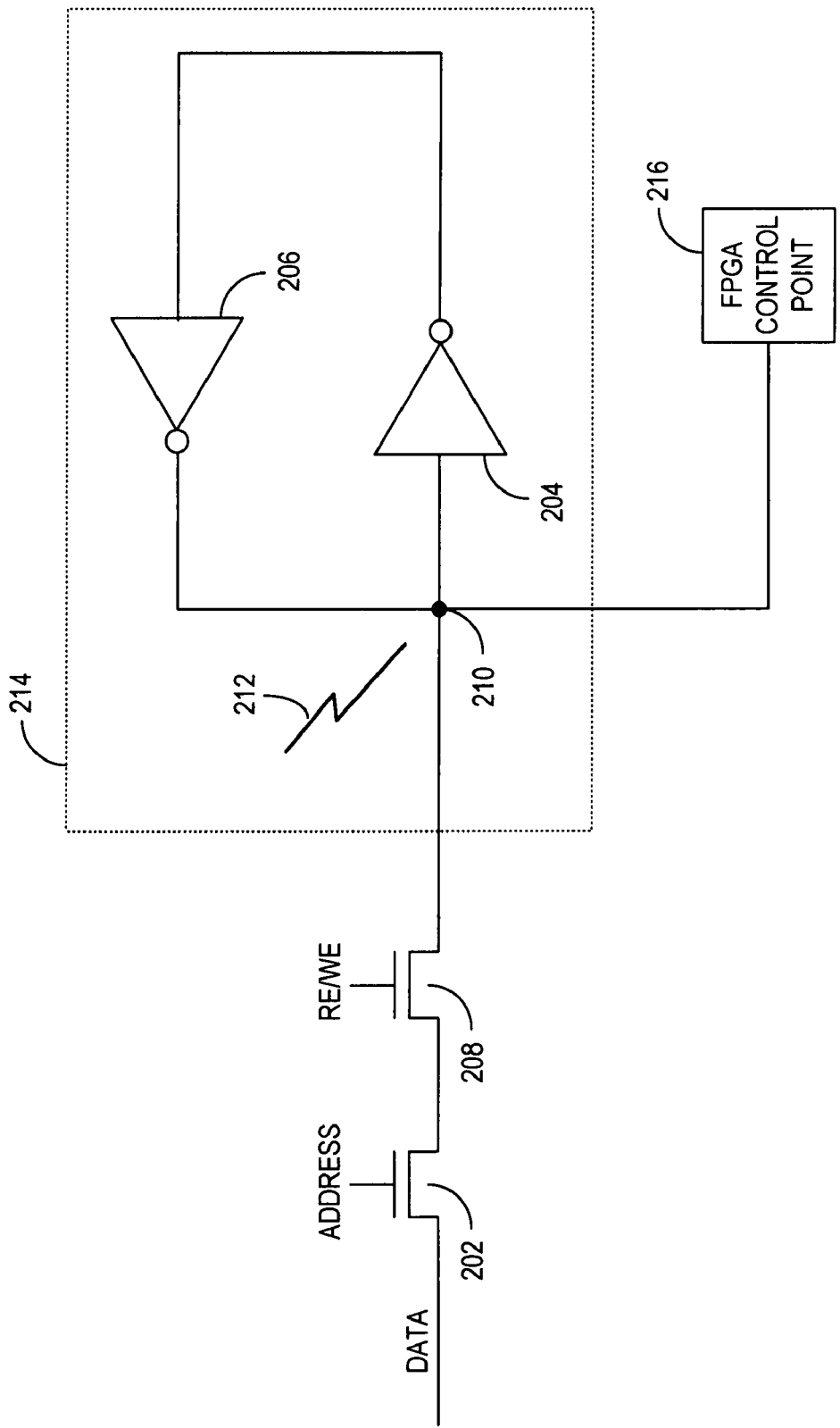
FIG. 2 illustrates an exemplary memory cell contained within a programmable logic device (PLD)

Turning to FIG. 2, a schematic diagram of one embodiment of a configuration memory cell is exemplified. Pass gates 202 and 208 determine access to configuration memory cell 214. In particular, pass gate 202 accepts signal ADDRESS, whose logic high level is effective to render pass gate 202 conductive if configuration memory cell 214 is addressed for either write or read access. Pass gate 208 may provide optional read/write enabling of configuration memory cell 214 and is similarly rendered conductive by signal RE/WE, whenever configuration memory cell 214 is to be read from or written to.

In operation, configuration memory cell 214 is programmed with signal DATA when both ADDRESS and WE signals are active, e.g., asserted to a logic high level. Node 210 then receives signal DATA and through operation of the inverter network of inverters 204 and 206, the logic value of signal DATA is maintained at node 210. The logic value at node 210 is then routed to FPGA control point 216, which is effective to configure a portion of the FPGA for a particular logic function. It should be noted that other memory configurations, such as capacitive storage, may be used to implement configuration memory cell 214 as a static configuration memory cell.

The determination of whether configuration memory cell 214 is to be utilized for a particular design is generally determined by the PLD design tool. The design tools generally accept hardware design language (HDL) definitions, or schematics, which are then used to generate net lists to indicate point to point connectivity of reconfigurable logic and interconnect resources. From the net lists, additional tools will map the design to logic, determine the optimal placement of the logic, and then route signal paths between the logic. From this "place and route" operation, a configuration bit file is generated, which may be used to program the PLD.

A computing station, for example, may be used to execute core synthesis tools to aid in the minimization and optimization of the equations extracted from the HDL files and/or schematics. A compiler, for example, may parse through the HDL behavioral source code to extract known functions, e.g., arithmetic functions, multiplexers, memories, etc. An optimization block, timing block, and an integrated software environment (ISE) block may then interoperate to formulate a design that is substantially dependent upon the intended PLD target's architecture and context. The context, for example, may influence inter-function optimizations such as replication, merging, re-timing, and pipelining. The context may be defined by the timing requirements and topology of the design.

As discussed above, however, configuration memory cell 214 may be susceptible to SEUs, which may be induced by a neutron strike 212, causing emission of alpha particles from within the semiconductor substrate of configuration memory cell 214. The emission of the alpha particles may then be effective to flip the logic state at node 210 to its alternate binary logic state. That is to say, for example, that a logic "1" at node 210 could be flipped to a logic "0" in response to the SEU. Conversely, a logic "0" could be flipped to a logic "1". It can be seen, therefore, that since the logic state of node 210 may be continuously sensed by FPGA control point 216, any logic reversal at node 210 could cause a failure within its respective FPGA.

Figure 3:
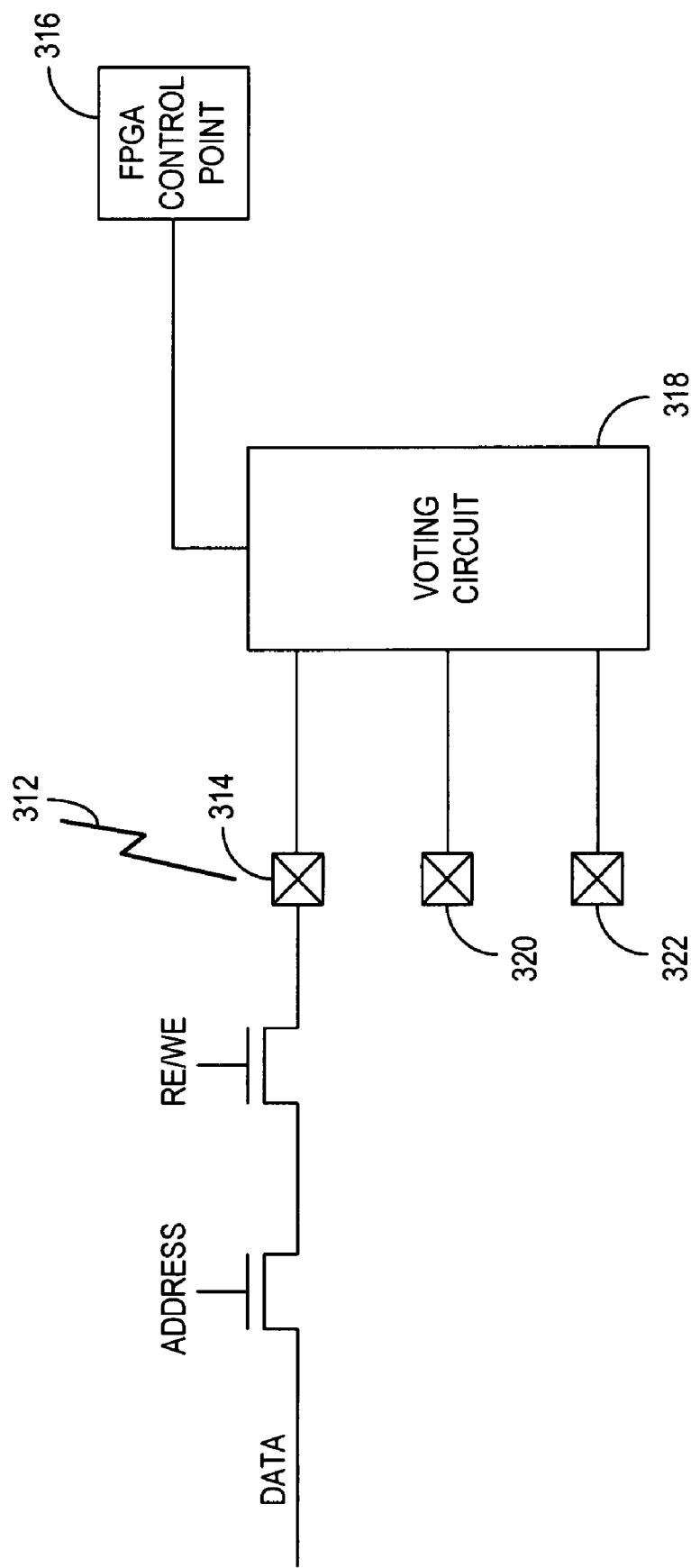
FIG. 3 illustrates an exemplary memory cell voting circuit.

Turning to FIG. 3, an alternative embodiment of a configuration memory cell is exemplified, whereby a voting circuit is employed to make use of redundant memory cells that may be available to provide a high reliability mode of operation. In particular, along with configuration memory cell 314, redundant configuration memory cells 320 and 322 are utilized, such that if an incorrect logic state of configuration memory cell 314 is sensed, the logic state of configuration memory cell 320 and 322 is used to mitigate the error.

In one embodiment, the logic values contained within redundant configuration memory cells 320 and 322 are written by the design tool that is used to program configuration memory cell 314. In particular, signal DATA that is used to program memory cell 314 is also used to program the logic value contained within redundant configuration memory cells 320 and 322 once they have been identified as being unused for a particular design. Once programmed, configuration memory cells 314, 320, and 322 combine to form a triple modular redundancy (TMR) configuration, which is then used by voting circuit 318 to ensure that the correct logic value is provided to FPGA control point 316 even when one of the three configuration memory cells is subjected to an SEU. In particular, voting circuit 318 compares the logic state at configuration memory cell 314 with the logic states of redundant configuration memory cells 320 and 322. By invoking a TMR algorithm, voting circuit 318 requires a majority vote between configuration memory cells 314, 320, and 322 in order to validate the logic state presented to FPGA control point 316. Thus, if any one of the three configuration memory cells 314, 320, and 322 changes state (flips) due to an SEU, the value in the flipped memory cell is ignored, and the value stored in the other two memory cells is passed to FPGA control point 316.

Voting circuit 318 implements the majority rule Boolean function of equation (1), $$D = A\&B | B\&C | C\&A, \quad (1)$$

where D is the output of the voting circuit, A is the logic value contained within the first configuration memory cell, B is the logic value contained within the second configuration memory cell, C is the logic value contained within third configuration memory cell, "&" is the logical AND operator, and "|" is the logical OR operator.

TABLE 1

| A | B | C | D |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Thus, given a majority number of logic low valued configuration memory cells, i.e., 2 or more out of 3, an output logic value of "0" will be selected by the respective voting circuit as illustrated in Table 1. On the other hand, given a majority of logic high valued memory cells, i.e., 2 or more out of 3, an output logic value of "1" will be selected by the respective voting circuit as similarly illustrated in Table 1.

In some embodiments, voting circuit 318 also includes logic to correct the flipped value of one of the memory cells based on the value stored in the majority of the remaining memory cells. Such correction logic is well known in TMR circuitry.

The number of configuration memory cells actually utilized by a given design implementation may include, for example, only 10% of the available configuration memory cells, which leaves a large percentage of configuration memory cells as redundant configuration memory cells. This condition is due to the fact that most configuration bits control interconnect multiplexers, whose control values are "don't care", i.e., unused. Thus, FIG. 3 may depict a situation, whereby configuration memory cell 314 impacts a given design implementation of a PLD, and configuration memory cells 320 and 322 constitute two of the many configuration memory cells that do not impact the design implementation. In such an instance, the reliability of the design implementation may be enhanced through the utilization of configuration memory cells 320 and 322 as redundant memory elements used to provide error mitigation of the flipped logic state of configuration memory cell 314.

Figure 4:
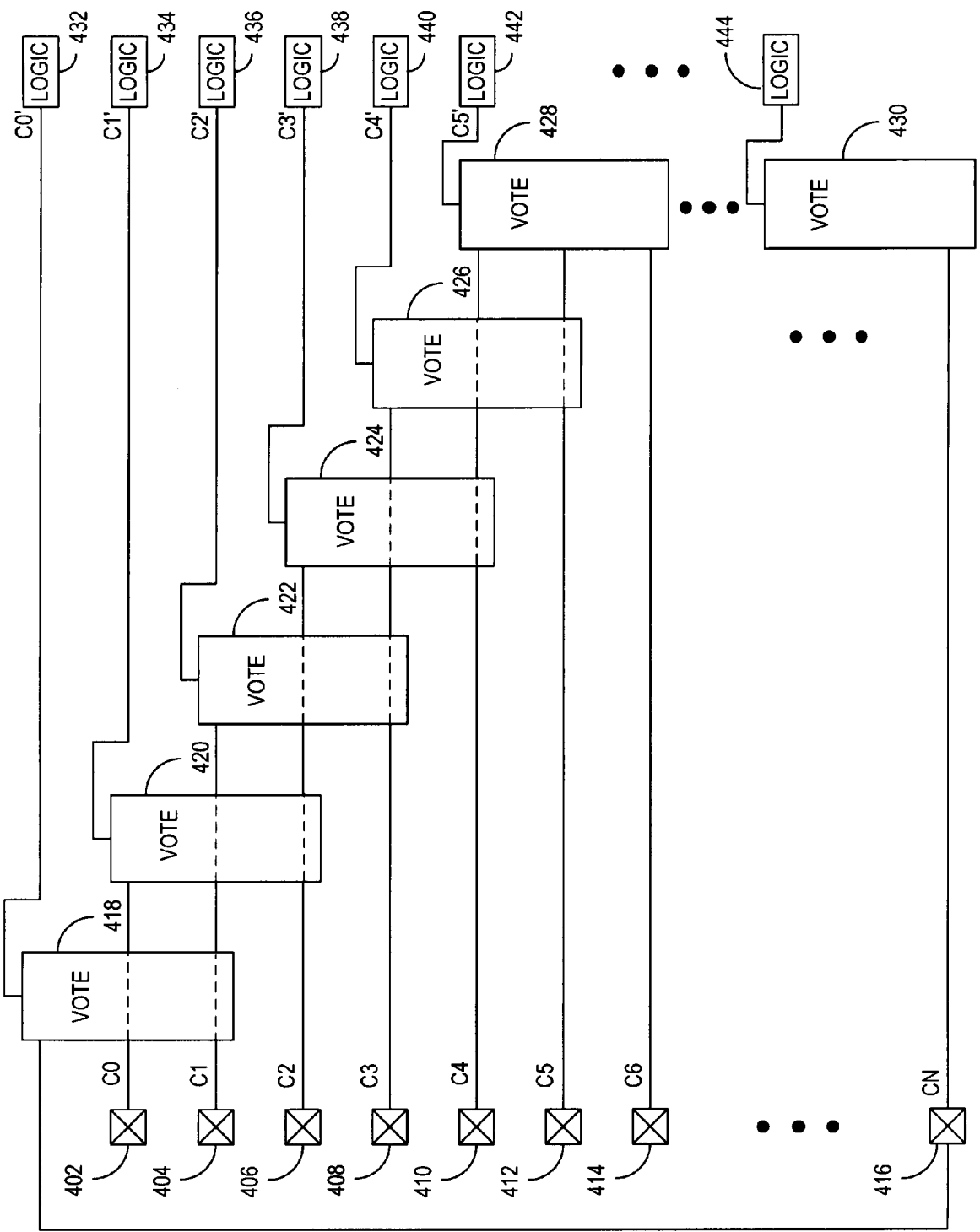
FIG. 4 illustrates an alternative memory cell voting circuit.

Turning to FIG. 4, a voting control circuit is exemplified, which provides voting control for every three configuration memory cells as discussed above in relation to FIG. 3. It should be noted, however, that a voting circuit for any odd number of configuration memory cells, e.g., 3, 5, 7, 9, etc., may be used to achieve enhanced results as discussed in more detail below.

As can be seen, voter circuits 418-430 each receive logic values from three configuration memory cells. Furthermore, two of the three logic values received by one voter circuit are also received by a neighboring voter circuit. For example, voter circuit 420 receives the logic values associated with configuration memory cells 402 C0, 404 C1, and 406 C2, and provides validated logic signal C1' to the FPGA control point affecting logic element 434. Neighboring voter circuit 422 receives the logic values associated with configuration memory cells 404 C1, 406 C2, and 408 C3, and provides validated logic signal C2' to the FPGA control point affecting logic element 436. Logic values for logic elements 432 and 438-444 may be similarly validated. For the purposes of the present exemplary description, "neighboring voter circuits" can be physically adjacent circuits (i.e., physically located next to one another), or conceptually adjacent circuits (e.g., utilizing shared memory cells programmed by bits appearing in adjacent positions in the configuration bit stream), or both.

In a first embodiment, a particular design implementation may only utilize every third configuration memory cell. That is to say, for example, that for a given design implementation, out of configuration memory cells 402-414 (C0-C6), only configuration memory cells 404 C1 and 410 C4 may be utilized. In such an instance, configuration memory cells C0, C2, C3, and C5 are considered redundant, since they are not needed to implement the design.

The neighboring configuration memory cells C0 and C2 may then be programmed to contain the same logic value as configuration memory cell C1 to form a configuration memory cell triplet input to voter circuit 420. Neighboring configuration memory cells C3 and C5 may also be programmed to contain the same logic value as configuration memory cell C4 to form another configuration memory cell triplet input to voter circuit 426. Such a design is effective to render a TMR mode of operation, such that no further action is required for validation of logic signals C1' and C4'.

In a second embodiment, a particular design implementation may not necessarily utilize only every third configuration memory cell. In such an instance, therefore, certain neighboring configuration memory cells may be utilized in the same design and are thus not available as redundant configuration memory cells. Based upon their particular logic value and their neighbor's logic values, however, they may nevertheless be utilized in a TMR validated design implementation.

For example, referring again to FIG. 4, configuration memory cells 402 C0, 404 C1, and 406 C2 contribute to provide validated logic signal C1' to control logic element 434. If C1 404 is at a logic high value, then for proper TMR operation, C0 402 and C2 406 should also be at a logic high value. For a given design implementation, however, validated logic signal C2' may also be required to control logic element 436. The configuration memory cell triplet that contributes to the logic value of C2' includes configuration memory cells C1 404, C2 406, and C3 408. Configuration memory cells C1 404 and C2 406 should be a logic high level for proper TMR operation in providing validated logic signal C1'. Thus, if the required logic value of C2' is also a logic high value and the logic value of configuration memory cell C3 is a logic high value, then C2' is a validated logic signal and as such, may continue to be used to control logic element 436.

Should the logic values of C2' and C3 not match up with the logic values of C1 and C2, however, then TMR validation of output C2' is not possible. In such an instance, a third embodiment can be used, in which a software algorithm is invoked to modify, or re-route, the original design implementation to "free up" a configuration memory cell. For example, given that C1' controls logic element 434, the design implementation may be altered to require, for example, that C4' and logic element 440, instead of C2' and logic element 436, be utilized in the design implementation so that proper TMR validation may be established as discussed above.

Given that only 10% of configuration memory is utilized by the exemplary design, however, a fairly low probability exists that a given configuration memory cell is utilized, such that only a small percentage of the design would need to be re-routed to free up configuration memory cells for TMR validation. For example, given that any one configuration memory cell is used in defining the exemplary design, then the probability of a neighboring configuration memory cell being used for the exemplary design is $1/10$.

Furthermore, even when utilized, the probability that the logic value of the neighboring configuration memory cell is different is $1/2$. Thus, the probability of the neighboring configuration memory cell being used for the exemplary design and having a different logic value is $1;10*1;2=1;20$. Similarly, the probability of a third configuration memory cell being both used in the exemplary design and different is also $1/20$. Thus, if TMR is needed for every configuration bit used in the design, then re-routing is only required in $/1;20+1;20=1;10$, or 10%, of the original design implementation.

In a fourth embodiment, TMR validated operation may not be required for all memory cells in the design. In such instances, it may be adequate to reduce the probability of the design being affected by an SEU. In this embodiment, TMR is applied where redundant memory cells are available, and voting circuits are left enabled when only two out of three cells contain the same value (simple majority); otherwise partial re-routing is performed.

For example, in the circuit of FIG. 4, configuration memory cells 402 C0, 404 C1, and 406 C2 contribute to validated logic signal C1' to help control logic element 434. If C1 404 is at a logic high value, then for simple majority operation, either of C0 402 or C2 406 should also be at a logic high value. For a given design implementation, however, voter circuit output C2' may also be required to help control logic element 436. The configuration memory cell triplet that contributes to the logic value of C2' includes configuration memory cells C1 404, C2 406, and C3 408. Given that configuration memory cells C1 404 and C2 406 are at a logic high value and that the required logic value of C2' is also a logic high value, then the logic value of configuration memory cell C3 is irrelevant. In this embodiment, C2' is a logic signal that is validated by a simple majority algorithm and may continue to be used to help control logic element 436. However, in this case the value provided by C2" is not protected.

Given that only 10% of configuration memory is utilized by the exemplary design, however, a low probability exists that another design iteration is required to free up redundant configuration memory cells for simple majority validation. For example, given that any one configuration memory cell is used in defining the exemplary design, then the probability of a neighboring configuration memory cell being used for the exemplary design is $1/10$.

Furthermore, the probability that the logic value of the neighboring configuration memory cell is different is $1/2$. Thus, the probability of the neighboring configuration memory cell being used for the exemplary design and having a different logic value is $1;10*1;2=1;20$. Similarly, the probability of a third configuration memory cell being both used in the exemplary design and different is also $1/20$. Thus, if a simple majority algorithm is utilized, then re-routing is only required in $1;20*1;20=1;400$, or 0.25%, of the original configuration design implementation. TMR would still be provided for $1-(1/20+1/20)=9/10$, or 90%, of the original configuration design implementation.

In a fifth embodiment, TMR validated operation may not be required for every bit in the entire design implementation. In such instances, it may be adequate to reduce the probability of the design being affected by an SEU. In this embodiment, TMR is applied where redundant memory cells are available, and is disabled where redundant memory cells are not available, optionally after attempting to re-implement the design as described above.

For example, in some embodiments the voting circuits may be disabled for cases where re-routing does not yield the desired configuration output. Referring again to FIG. 4, in one embodiment, when voting circuit 420 is enabled, the output signal C1' is a TMR logical result for the contents of memory cells 402, 404, and 406 (C0, C1, and C2). When voting circuit 420 is disabled, the output signal C1' is the same as the contents of memory cell 404 (C1).

Disabling each voting circuit of FIG. 4, however, would itself require a configuration memory cell for each voting circuit to be disabled, which effectively doubles the amount of configuration memory used. If, however, disabling of the voter circuits occurs using a coarse granularity of 10 or 100, then the number of configuration memory cells required to disable the voting circuits only increases by 10% or 1%, respectively.

Given that only 10% of configuration memory is utilized by the exemplary design, a low probability exists that voting disabling is required for a particular voting circuit. For example, given that any one configuration memory cell is used in defining the exemplary design, then the probability of a neighboring configuration memory cell being used for the exemplary design is $1/10$. Furthermore, even when utilized, the probability that the logic value of the neighboring configuration memory cell is different is $1/2$. Thus, the probability of the neighboring configuration memory cell being used for the exemplary design and having a different logic value is $1;10*1;2=1;20$. Similarly, the probability of a third configuration memory cell being both used in the exemplary design and different is also $1/20$. Thus, for a simple majority validation algorithm, disabling of voting is only required in $1;20*1;20=1;400$, or 0.25%, of the original design implementation.

If the voting circuits are disabled in blocks of 100, then on average 10% of 100, or 10 configuration memory cells, would be unprotected. Since, in this example, disabling is done in blocks of 100 memory configuration cells, the proportion of unprotected configuration memory cells is 0.25%*10 or 2.5%. TMR would still be provided for $(1-(1/20+1/20))\%-2.5\%$, or 87.5%, of the original design implementation.

It can be seen that by increasing the number of voting inputs from 3 to some higher odd number, such as 5, 7, etc., then the correction coverage using a voting algorithm is increased. Given a 5-input voting configuration, for example, a voting algorithm is effective to validate the exemplary design, even though 2 out of 5 configuration memory cells may have sustained a flipped logic state due to an SEU. Thus, whereas a 3-input voting algorithm may sustain a single SEU induced error and still maintain a validated design, a 5-input voting algorithm may sustain two SEU induced errors and still maintain a validated design.

Similarly, a reduced probability exists such that the exemplary design needs to be re-routed when utilizing an increased number of voting inputs. Taking the 5-input voting configuration as discussed above, for example, one out of the five configuration memory cells may not qualify as redundant configuration memory cells for a particular design, because they may be used to implement the design. Those configuration memory cells may nevertheless be used in a validated design, provided that the remaining configuration memory cells can support the simple majority algorithm as discussed above. In other words, if the remaining configuration memory cells are not used in other designs, or if they are used in other designs, but their respective logic values are in agreement with one another, then the remaining configuration memory cells may be used by a simple majority algorithm to validate the exemplary design without the need for re-routing.

Figure 5:
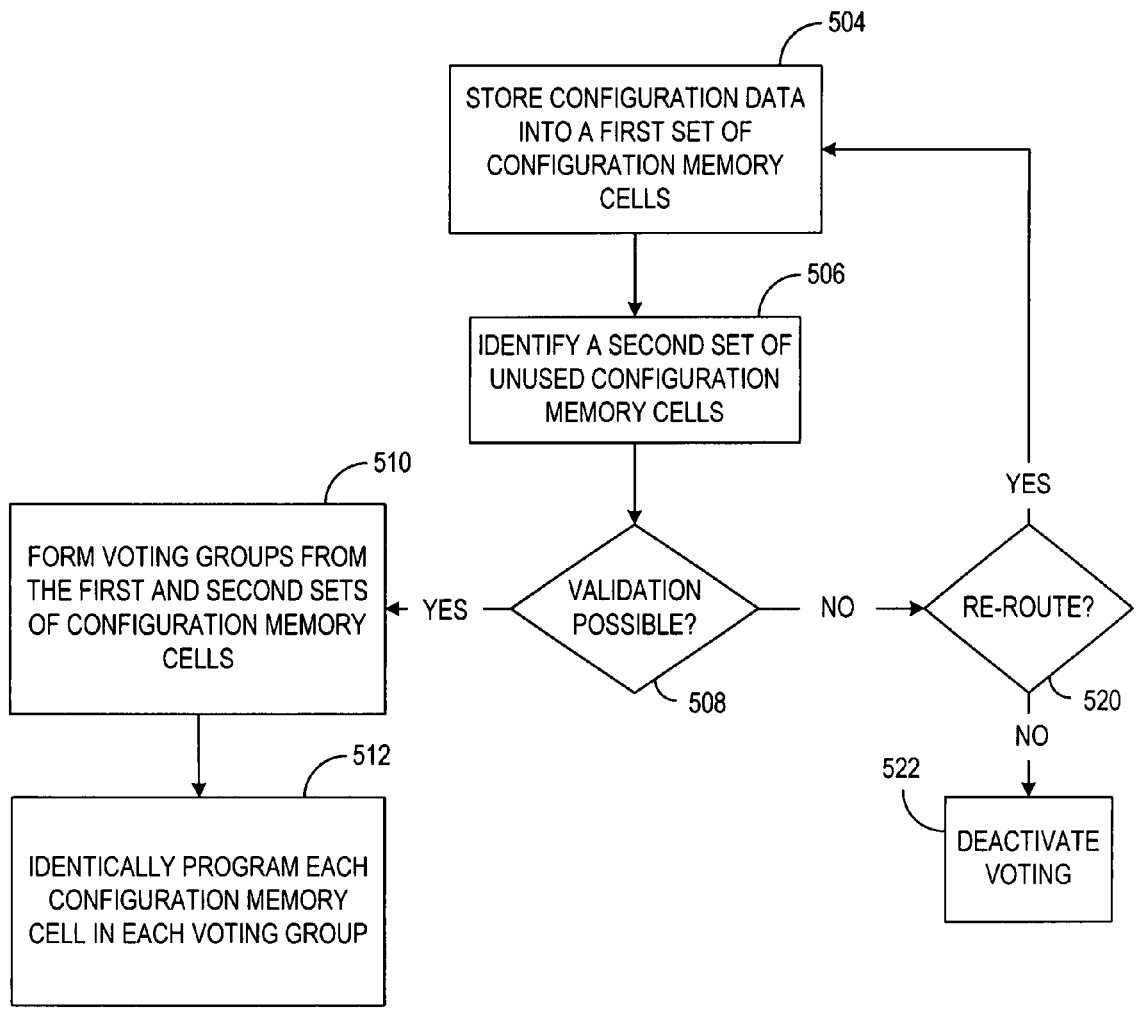
FIG. 5 illustrates an exemplary flow diagram of a method used to reliably configure a PLD.

Turning to FIG. 5, a flow diagram exemplifying a method of reliably configuring a PLD is illustrated. In step 504, configuration data is programmed into a first set of configuration memory cells within the PLD. In one embodiment, the PLD design tool being utilized may direct the configuration data into adjacent and/or non-adjacent configuration memory cells as required. Once the configuration memory cells are programmed, a survey of the un-programmed configuration memory cells is taken as in step 506. Any un-programmed configuration memory cells that are found to exist are then identified as being available for TMR.

If configuration memory cell validation is possible as determined in step 508, then voting groups are formed in step 510 from the programmed and un-programmed configuration memory cells as determined in steps 504 and 506. Each voting group is configured to contain an odd number of configuration memory cells, whereby in one embodiment, a single programmed configuration memory cell is either grouped with un-programmed configuration memory cells, or with a combination of identically programmed and un-programmed configuration memory cells. Once each voting group is formed, the un-programmed configuration memory cells within each voting group are programmed in step 512 with the identical logic values that are contained within the programmed configuration memory cell voting group counterparts as formed in step 504.

If configuration memory cell validation is not possible, then a decision may be made as in step 520, to re-implement all or part of the design. Such a re-implementation may be attempted, for example, in an effort to re-distribute the programmed configuration memory cells in a manner that is more conducive to validation. That is to say, for example, that the PLD design tool may attempt to create a distribution of programmed configuration memory cells that are physically, and/or logically, separated by un-programmed configuration memory cells. As such, un-programmed configuration memory cells may be strategically placed by the PLD design tool so that they may be more easily combined into voting groups with their programmed configuration memory cell counterparts. Voting circuitry may also be deactivated altogether as in step 522, in which case, only the first set of configuration memory cells programmed in step 504 are used to program the PLD's control points.

As discussed above, configuration memory errors are detected and mitigated by providing the correct configuration information to the PLD control points that define a particular design. The contents of the corrupted configuration memory cells may themselves be corrected through the use of block-wise CRC techniques, or through memory scrubbing procedures. Frequency of use of these techniques may be on the order of minutes, hours, or even days due to the low occurrence of SEUs in normal operating environments.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of reliably configuring a programmable logic device (PLD), the method comprising:
    storing configuration data into a first portion of configuration memory cells existent within the PLD to define a logic function;
    identifying a second portion of configuration memory cells that are void of the configuration data that defines the logic function; and
    utilizing the second portion of configuration memory cells as redundant memory cells, wherein the redundant memory cells are used to verify a validity of the configuration data stored within the first portion of configuration memory cells.

2. The method of claim 1, further comprising:
    re-routing the design prior to storing the configuration data to facilitate utilizing the second portion of configuration memory cells as redundant memory cells.

3. The method of claim 2, further comprising:
    deactivating the utilization of configuration memory cells as redundant memory cells in at least one portion of the PLD.

4. The method of claim 1, wherein storing configuration data into the first portion of configuration memory cells comprises storing configuration data into non-adjacent configuration memory cells.

5. The method of claim 1, wherein storing configuration data into the first portion of configuration memory cells comprises storing configuration data into adjacent and non-adjacent configuration memory cells.

6. The method of claim 1, wherein utilizing the second portion of configuration memory cells comprises:
    grouping configuration memory cells of the first and second portions of configuration memory cells to form voting groups;
    programming the second portion of configuration memory cells in each voting group with the same configuration data as the respective first portion of configuration memory cells in each voting group; and
    comparing the configuration data of each configuration memory cell in each voting group to validate the configuration data of each configuration memory cell in the first portion.

7. The method of claim 6, wherein grouping the configuration memory cells comprises grouping the configuration memory cells into voting groups having an odd number of members.

8. The method of claim 7, wherein comparing the configuration data of each configuration memory cell in each voting group comprises requiring a majority agreement among the members for validation.

9. The method of claim 7, wherein the configuration data of each configuration memory cell in each voting group has an identical value to the other configuration memory cells in the same voting group.

10. The method of claim 7, wherein for at least one of the voting groups, a majority of the memory cells in the voting group store a first value, and a minority of the memory cells in the voting group store a second value different from the first value.

11. A method of mitigating configuration memory cell errors in a programmable logic device (PLD), the method comprising:
    programming a first set of configuration memory cells to implement a logic function;
    identifying a second set of configuration memory cells that are not programmed for the logic function;
    programming a portion of the second set of configuration memory cells to reflect a logic state of a corresponding portion of configuration memory cells in the first set;
    comparing logic values of the portion of the second set of configuration memory cells to logic values of the corresponding portion of configuration memory cells in the first set;
    selecting a logic value from the compared logic values that conforms to a redundancy rule; and
    applying the selected logic value to a control point within the PLD to implement the logic function.

12. The method of claim 11, further comprising:
    re-routing the design to facilitate the programming the portion of the second set of configuration memory cells.

13. The method of claim 12, further comprising:
    deactivating the programming the portion of the second set of configuration memory cells in at least one portion of the PLD.

* * * * *